United States Patent [19]
Samachisa et al.

[11] Patent Number: 5,579,259
[45] Date of Patent: Nov. 26, 1996

[54] LOW VOLTAGE ERASE OF A FLASH EEPROM SYSTEM HAVING A COMMON ERASE ELECTRODE FOR TWO INDIVIDUALLY ERASABLE SECTORS

[75] Inventors: George Samachisa, San Jose; Jack H. Yuan, Cupertino, both of Calif.

[73] Assignee: SanDisk Corporation, Sunnyvale, Calif.

[21] Appl. No.: 453,124

[22] Filed: May 31, 1995

[51] Int. Cl.⁶ .............................. G11C 7/00; G11C 16/02
[52] U.S. Cl. .................. 365/185.14; 365/185.29; 257/316; 257/318
[58] Field of Search ................. 365/185.14, 185.11, 365/185.29; 257/316, 318, 319

[56] References Cited

U.S. PATENT DOCUMENTS

| | | | |
|---|---|---|---|
| 5,034,926 | 7/1991 | Taura | 365/185.14 |
| 5,036,378 | 7/1991 | Lu | 365/185.14 |
| 5,077,691 | 12/1991 | Haddad et al. | 365/218 |
| 5,295,106 | 3/1994 | Jinbo | 365/218 |
| 5,313,420 | 5/1994 | Masuoka | 365/185.14 |
| 5,336,936 | 8/1994 | Allen | 365/185.14 |
| 5,343,063 | 8/1994 | Yuan et al. | 257/317 |

*Primary Examiner*—David C. Nelms
*Assistant Examiner*—Son Mai
*Attorney, Agent, or Firm*—Majestic, Parsons, Siebert & Hsue

[57] ABSTRACT

A flash EEPROM is organized on an integrated circuit with individual erase gates being shared by two adjacent blocks (sectors) of memory cells. This reduces the number of erase gates and the complexity of the driving erase circuitry. Each of the two adjacent blocks are individually addressable for erasing. The control gates of the cells within the block that is not to be erased are held at a voltage close to that of the common erase gate, thus preventing their storage states from being disturbed. At the same time, the control gates of the block to be erased are held at a voltage that differs sufficiently from that of the erase gate to cause the erasure. In order to minimize the magnitude of the erase voltages, voltages applied to the common erase gate and the control gates of the block to be erased are substantially equal and of opposite polarities.

15 Claims, 5 Drawing Sheets

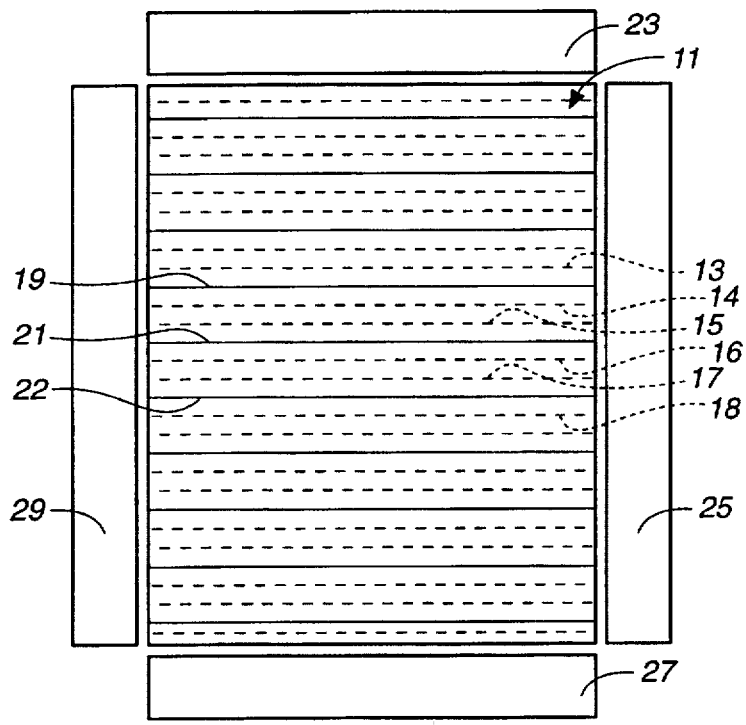
FIG._1
(PRIOR ART)
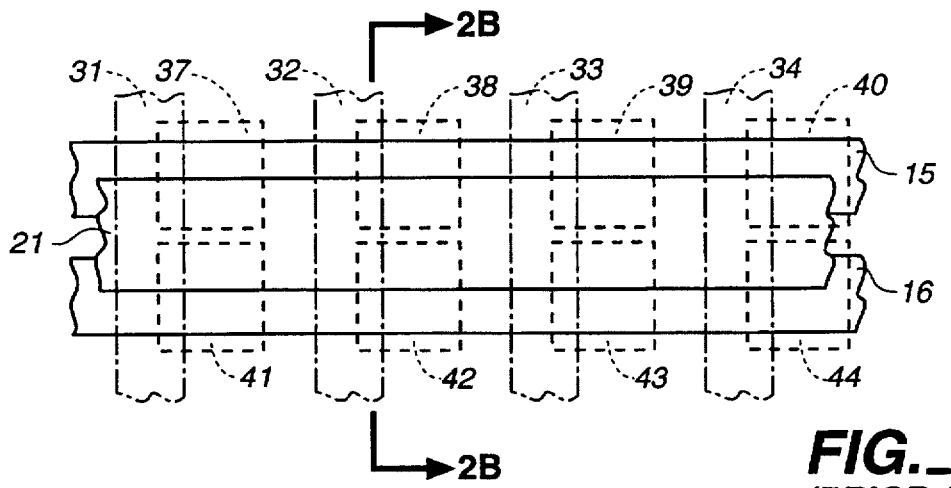
FIG._2A
(PRIOR ART)
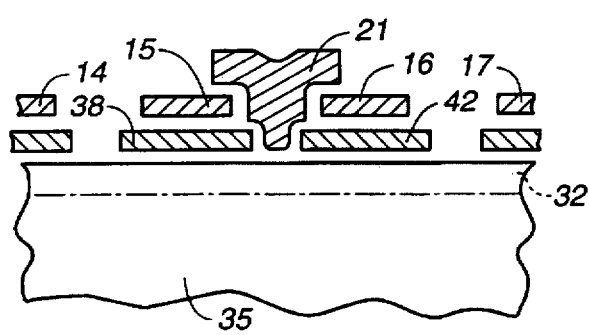
FIG._2B
(PRIOR ART)

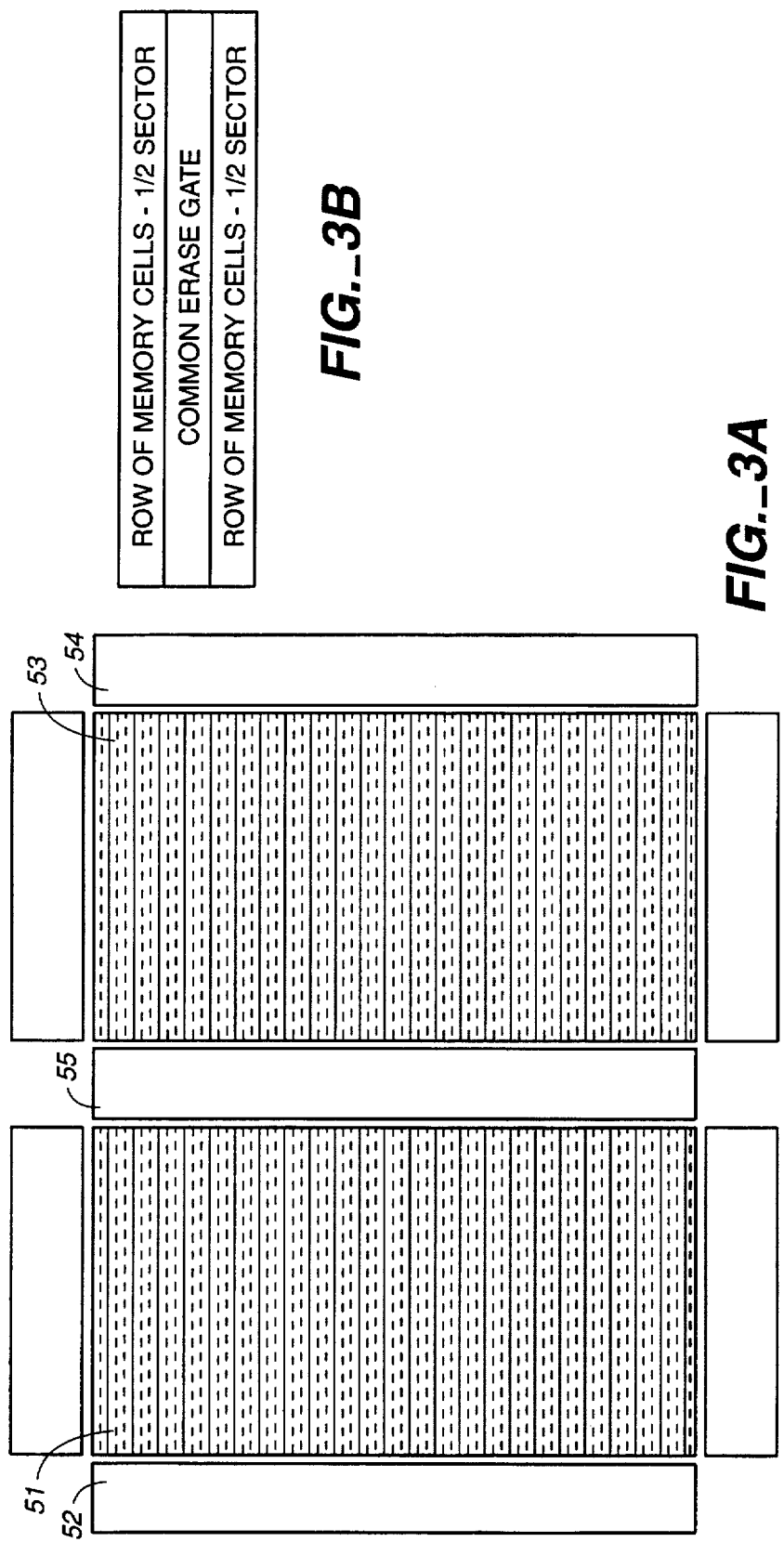
FIG._3A
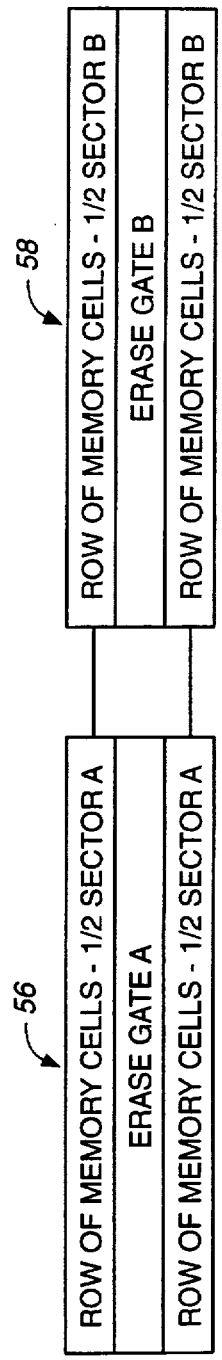
FIG._3B
FIG._3C

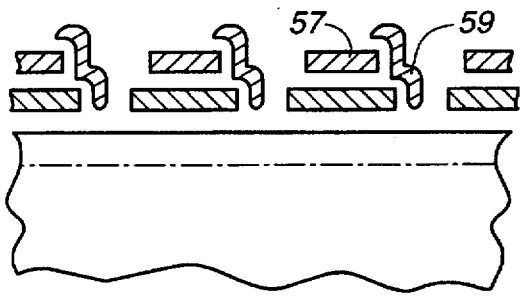
FIG._4A
| ROW OF MEMORY CELLS - ONE SECTOR |
|---|
| ERASE GATE (ONE PER ROW) |
FIG._4B
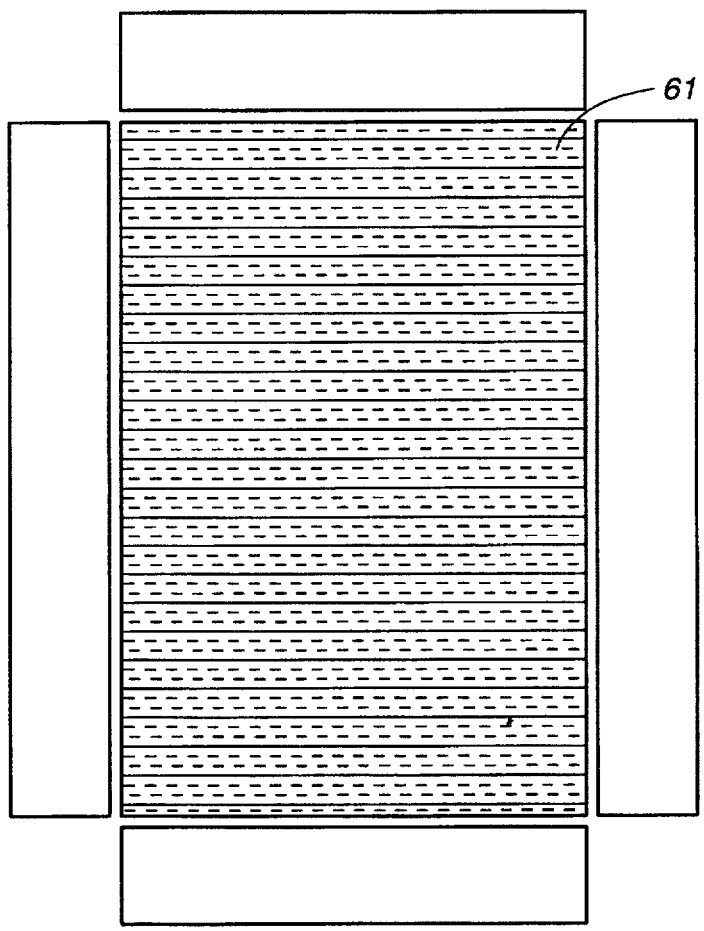
FIG._5A
| ROW OF MEMORY CELLS - ONE SECTOR |
|---|
| COMMON ERASE GATE |
| ROW OF MEMORY CELLS - ONE SECTOR |
FIG._5B

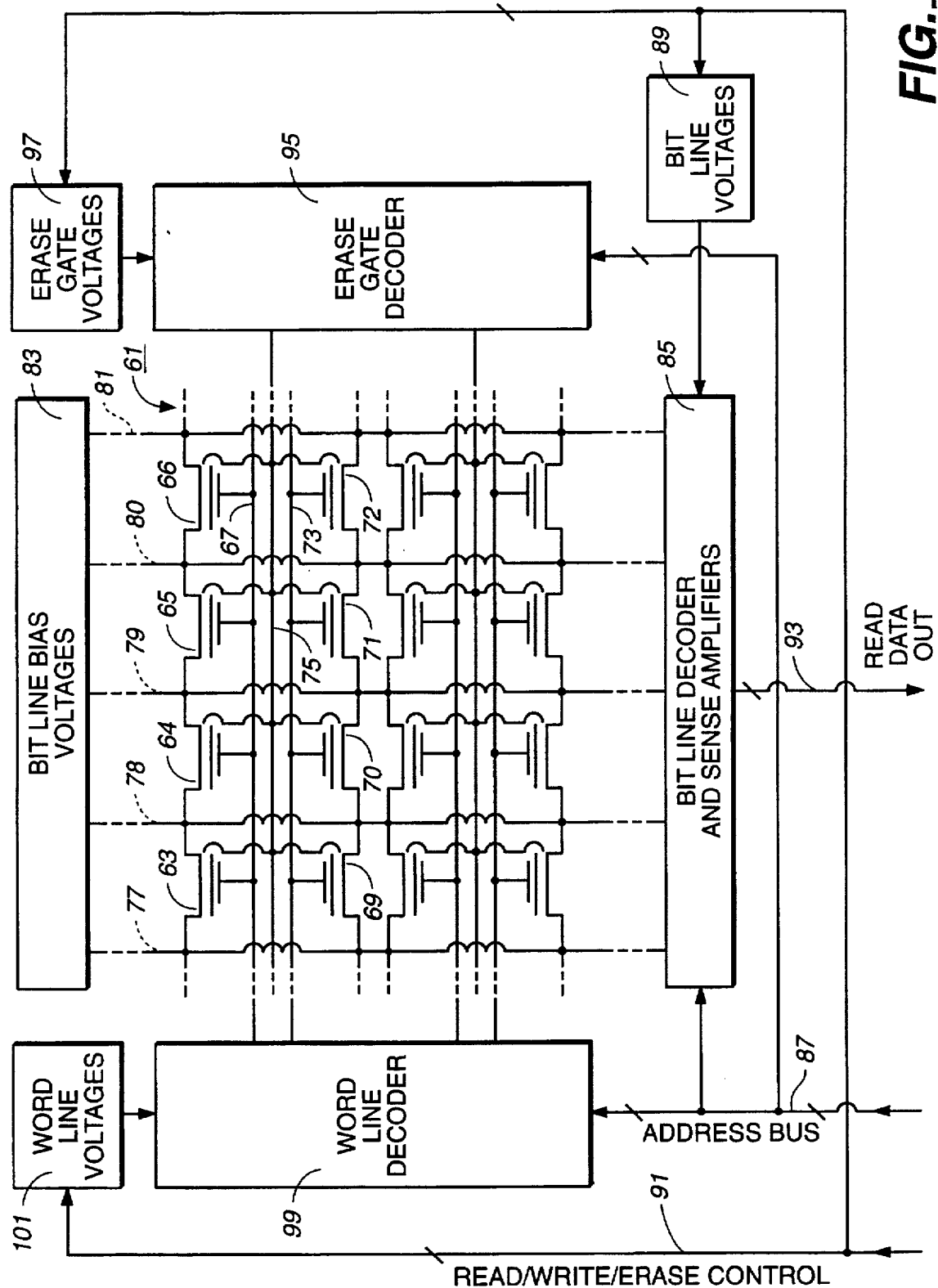
FIG._6

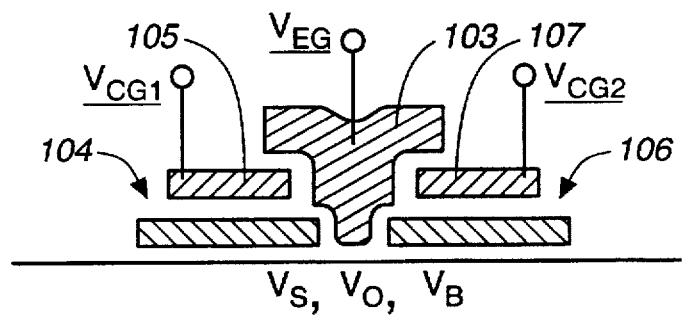
FIG._7
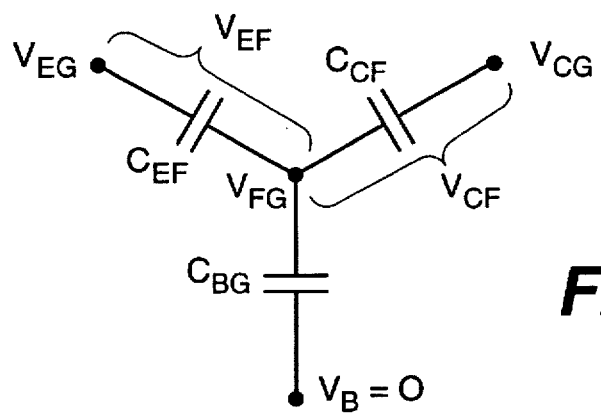
FIG._8
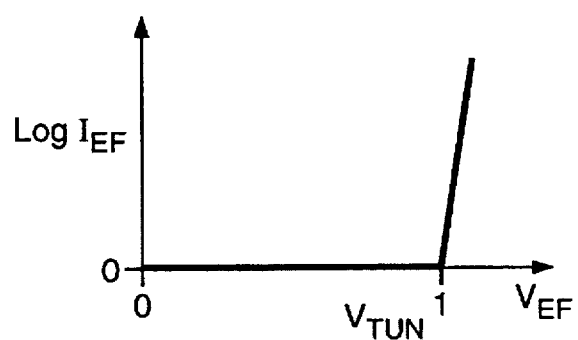
FIG._9

LOW VOLTAGE ERASE OF A FLASH EEPROM SYSTEM HAVING A COMMON ERASE ELECTRODE FOR TWO INDIVIDUALLY ERASABLE SECTORS

BACKGROUND OF THE INVENTION

This invention relates generally to electronic memories of a type formed on integrated circuits with memory cells having electrically floating gates, and, more specifically, to an arrangement of such cells and the erasure of a block of cells at a time.

Flash electrically erasable and programmable read only memories (EEPROMs) have an advantage of providing a large amount of non-volatile data storage in a small package. Usually, such a memory includes an array of EEPROM cells in rows and columns, along with addressing decoders, sense amplifiers and other peripheral circuits necessary to operate the array. In addition to the charge on a floating gate affecting the conduction between source and drain regions of the individual memory cells, a control gate which extends across a row of such cells to form a memory word line also controls the floating gate potential through a capacitive coupling with the floating gate. The source and drain regions form the memory array bit lines. The state of each memory cell is altered by controlling the amount of electron charge on its floating gate. One or more cells are usually programmed at one time by applying proper voltages to their control gates, sources and drains to cause electrons to be injected onto the floating gates. Prior to such programming, a block (sector) of such cells is generally erased to a base level by removing electrons from their floating gates to an erase electrode. In one form of device, this erase electrode is the source region of the cells. In another form of the device, a separate erase gate is provided.

The storage density of flash EEPROM memories is being increased. As is occurring with integrated circuits generally, the sizes of individual circuit elements are being shrunk as processing technology improves. In addition, flash EEPROM memory cells can be operated to store more than one bit of data by establishing multiple charge storing states for each cell. The effect of these trends is to shrink the size of the memory blocks (sectors) which store a set amount of data.

The erase electrodes of the memory cells in a block (sector) are arranged so that all the cells in the block (sector) are erased at one time. In the memory architecture of SunDisk Corporation, each sector contains 512 bytes of user data plus some overhead including a header for the sector data. Other architectures have much larger sector sizes, 64k bytes being one of the larger. In either case, if the block (sector) size is kept constant, then increasing memory capacity results in a larger proportion of the circuit chip area having to be devoted to interconnection lines and peripheral circuits to control the increasing number of blocks (sectors) that are being formed.

Therefore, it is a principal object of the present invention to reduce the extent of interconnection lines and peripheral circuits necessary to support a flash EEPROM array whose storage capacity is being increased.

During erasure of an EEPROM cell, electrons are pulled from the cell's floating gate, as a result of the Fowler-Nordheim tunneling mechanism, by an electrical field created between the floating gate and the erase electrode. The voltage applied to the erase electrode for erasure depends upon the approach used to erase the EEPROM cell. This voltage is in a range of about 9–13 volts when erasure is through a thin silicon dioxide layer, such as occurs when the erase electrode is the source diffusion, and about 15–23 volts when erasure is through an oxide layer interposed between a polysilicon floating gate and a polysilicon erase gate. For moderate values of erase currents, it is typical to generate an erase voltage of 10 volts or higher on the memory chip from a single voltage supply to the chip of 3 or 5 volts. This eliminates the need for the user to provide two different power supply voltages to the circuit chip. However, for a high erase voltage of about 20 volts or more, the circuit requires a significant amount of area and increases the complexity of the processing necessary to form the circuit. Also, the yield from the manufacturing process and the reliability of the resulting circuit decrease as the magnitude of the internally generated voltage increases.

Therefore, it is another principal object of the present invention to provide a technique for minimizing the magnitude of the erase voltage which must be generated on memory chip.

SUMMARY OF THE INVENTION

According to one aspect of the present invention, a single erase electrode is shared with the memory cells of two sectors, one of the sectors being erasable at a time by different voltages being applied to the control gates of the two sectors. For the sector to be erased, the control gate voltage is caused to be much different than the voltage applied to the erase electrode, while for the sector which is not to be erased, the control gate voltage is held at a level near that of the erase electrode. Of course, if it is desired to erase both of these sectors at the same time, their control gates are all held at the voltage level that is much different from the erase electrode voltage.

By using only one erase electrode for every two sectors, the number of individual conductors which communicate with the erase electrode and the amount of decoding circuitry, are substantially reduced from that which is required when each sector has its own separate erase electrode circuit. A further advantage of this arrangement is that the memory chip may be operated at one of two different memory density levels without any substantial change having to be made to keep the sector size constant. For example, if the number of memory cells provided in each of the sectors is sufficient to store a sector's worth of data when the cells are programmed into one of four states each (each cell storing two bits of data), that same memory may be operated with two states per memory cell (each cell storing one bit) by combining the two sectors together as one. When operating at a lower density, each of the pair of sectors is erased together as one by driving the control gates of the cells of both sectors to a voltage level sufficiently different of that of the erase electrode to cause erasure to occur.

According to a second aspect of the present invention, the magnitude of erase voltage required on the chip is minimized by generating on the chip both positive and negative erase voltages of about the same magnitude. The positive erase voltage is applied to the erase electrode and the negative erase voltage is applied to the control gates of the sector to be erased. In a specific implementation, the present need to generate on chip an erase voltage in excess of 20 volts is eliminated, being replaced by generators of around plus and minus 12 or 13 volts. This reduces the amount of space on the circuit chip required for the erase voltage generation circuit, makes it easier to make, can be made with a higher yield and operates with improved reliability.

Additional objects, advantages and features of the various aspects of the present invention are given in the following description of its preferred embodiments, which description should be taken in conjunction with the accompanying drawings.

BRIEF DESCRIPTION OF THE DRAWINGS

FIG. 1 shows in plan view the primary regions of a flash EEPROM integrated circuit chip of a present design;

FIG. 2A is an exploded view of a portion of the memory array of the circuit chip of FIG. 1;

FIG. 2B is a cross-sectional view of the portion of the array shown in FIG. 2A, taken at section 2B—2B thereof;

FIG. 3A shows one way to arrange the major sections of a flash EEPROM memory chip having a much greater storage density than that of FIG. 1;

FIG. 3B illustrates the structure of one sector of the memory chip of FIG. 3A;

FIG. 3C illustrates an alternate arrangement for the memory chip of FIG. 3A, showing two sectors;

FIG. 4A is a cross-sectional view of a memory array that illustrates yet another way of structuring the array when its bit storage density is significantly greater than that of FIG. 1;

FIG. 4B shows a sector organization of the array shown in FIG. 4A;

FIG. 5A illustrates a third way of organizing a flash EEPROM circuit chip which has a significantly greater bit storage density than that of FIG. 1;

FIG. 5B illustrates the sector structure of the chip array of FIG. 5A;

FIG. 6 is an expanded system diagram of the memory array chip of FIGS. 5A and 5B;

FIG. 7 illustrates the different voltages applied to the elements of the memory array illustrated in FIGS. 5A, 5B and 6;

FIG. 8 is a schematic circuit which illustrates the coupling between the gates of an EEPROM memory cell used in any of the foregoing arrangements; and FIG. 9 is a curve which illustrates the current-voltage characteristics of a tunnel oxide employed as an erase gate dielectric in any of the foregoing memory array embodiments.

DESCRIPTION OF THE PREFERRED EMBODIMENTS

Referring initially to FIGS. 1, 2A and 2B, the aspects of existing flash EEPROM integrated circuit chips that are pertinent to the present invention are described as background. A central portion 11 of the circuit chip contains a two-dimensional array of individual memory cells in rows and columns. Control gates, such as gates 13–18, extend across rows of cells and serve as word lines for the memory array. In the examples given herein, the erase electrodes are in the form of erase gates, such as gates 19–22, one of which is positioned between every other control gate. Elongated diffusions which form the sources and drains of the memory cells extend vertically in the array 11 and form the bit lines of the array. Peripheral circuits 23, 25, 27 and 29 provide the support and interconnection with the memory array 11. The circuits 23, for example, can provide bit line biases, the circuits 25 can include a decoder for addressing and connecting appropriate voltages to the erase lines, peripheral circuits 27 can include bit line decoders and sense amplifiers, and peripheral circuits 29 can include a word line decoder for connecting appropriate voltages to selected ones of the control gates. This is only a general outline of one of many possible arrangements of circuits on a flash EEPROM chip.

An exploded view of a small portion of the memory array 11 is shown in FIG. 2A, a cross-sectional view of which is given in FIG. 2B. Control gates 15 and 16 extend across adjacent rows of cells while erase gate 21 is positioned in between the cells of these rows. Arranged perpendicularly to these elongated gates are the lengths of diffusions 31, 32, 33, and 34, among others, that are spaced apart across the width of the array 11. These diffusions are formed in a surface of a semiconductor substrate 35 on which the memory system of FIG. 1 is formed. Positioned in between each pair of diffusions along one row of memory cells is a floating gate such as floating gates 37–40. Floating gate 41–44 are part of an immediately adjacent row. The erase gate 21, as best seen from FIG. 2B, is separated from edges of the floating gates in both rows by a layer of tunnel oxide (not shown). Other gate and oxide layers, as are well known, are included in the structure being described but are omitted from these figures for simplicity.

It will be noted from FIG. 2A that each of the floating gates extends only part way across a channel between adjacent source and drain diffusions. This form of EEPROM cell is termed a "split-channel" type. In such a cell, the space between the floating gate and a spaced apart diffusion forms a select transistor that is connected in series with the floating gate transistor, as is well known. However, the various aspects of the present invention apply equally well to an array of memory cells without the select transistor. The floating gates of such memory cells then extend completely across the channel between adjacent source and drain diffusion regions. As is typical, the floating, control and erase gates are all made of doped polysilicon and formed in separate steps from three different polysilicon layers (triple poly).

The specific form of memory cell and array, and the process of forming them, varies widely. Examples are given in U.S. Pat. Nos. 5,070,032, 5,095,344 and 5,343,063. Additional forms of the structures and processes are given in copending U.S. application Ser. No. 08/248,735 filed May 25, 1994. Each of these patents and application are expressly incorporated herein by this reference. It will be recognized from this description, however, that the present invention is not limited to any specific flash EEPROM system structure or method of manufacture.

The memory array 11 is organized into blocks (sectors) of cells that are addressable as a block and simultaneously erasable. Two rows of cells form a sector. An example sector includes the two rows of which a portion is shown in FIG. 2A. Each sector has a single erase gate. All of the cells in the two rows illustrated in FIGS. 2A and 2B are erased, in existing devices, by raising the voltage of the erase gate 21 to 20 or more volts while holding the control gates 15 and 16 of each of the two rows at ground potential. This sector structure is also schematically illustrated in FIG. 3B.

As improvements in processing technology allow the elements of the array 11 to be made smaller and smaller, the length of the rows of cells for a given sector size becomes shorter. If the cell density is increased by two, for the same sector size, the length of the rows is cut in half, allowing the formation of two such arrays 51 and 53, in an arrangement of FIG. 3A, in about the same space as occupied by the earlier array 11 of FIG. 1. However, the great increase in number of erase and control gates requires additional peripheral circuits and conductors to be added, such as additional circuitry in an area 55 between the two arrays 51 and 53. Each of the arrays 51 and 53 also has its own word line decoders 52 and 54. As the density of the memory cell arrays increases significantly, it has been found that a larger percentage of the circuit chip area becomes necessary for these peripheral circuits and interconnecting lines. For each of the arrays 51 and 53 of FIG. 3A, the sector organization remains as illustrated in FIG. 3B. Each of the rows of cells extends completely across one of the arrays 51 or 53. The rows have simply been reduced in length. This same sector organization illustrated in FIG. 3B is used in each of the arrays 51 and 53 of FIG. 3A.

The amount of circuit area required for peripheral circuits and interconnecting lines in the arrangement of FIG. 3A can be reduced somewhat if the rows of each of the arrays 51 and 53 have their word lines (control gates) connected together. This modification is illustrated in FIG. 3C. The word lines of one sector 56, formed of two rows of the array 51, are connected across the erase gate decoding and interconnecting circuits 55 to the word lines of rows in a sector 58 that are similarly positioned in the array 53. This allows one of the word line decoding and interconnecting circuits 52 or 54 to be eliminated. One of the two sectors 56 or 58 of FIG. 3C is selectively erased by raising the voltage on its erase gate while the voltage of the erase gate of the other one of these sectors is held at zero volts. The arrangement illustrated in FIG. 3C has been incorporated for a time in a chip product of SunDisk Corporation, assignee of the present application.

An improved sector organization is alternatively illustrated with respect to FIGS. 4A and 4B. As the density of the array 11 of FIG. 1 is increased, the sector is made to be a single row since, in the examples being considered, there are now twice as many memory cells in each row. This organization is shown in FIG. 4B. The number of memory cells in each row of the individual sectors is increased rather than dividing the row into two, as done in the embodiment of FIGS. 3A and 3B. Each row now needs to have its own erase gate, such as illustrated in the sectional view of FIG. 4A where one row includes a control gate 57 and its own erase gate 59. But this still doubles the number of erase gates with which connections need to be made, thus also increasing the area of the peripheral circuits and connections which are necessary to support such an array. Also, since there is one erase gate per row of memory cells, the cell size increases. This size is determined in one direction by the erase gate pitch.

Therefore, a technique has been devised for sharing an erase gate with adjacent rows of cells where each row constitutes a sector. This organization is shown in FIG. 5B. Each of the one row sectors of memory cells extends completely across an array 61 of FIG. 5A. One half the number of erase gates is thus utilized for the same size memory which is formed in the manner shown in FIG. 3A. Thus, the size and complexity of the peripheral circuits and number of erase gate connecting lines are similarly reduced.

Before discussing operation of the array which allows use of a single erase gate for two sectors, the array itself is described in more detail with respect to FIG. 6. A portion of the array 61 includes cells 63–66 in one row which share a word line 67 that is connected to each of the cell's control gates. Similarly, an adjacent row includes cells 69–72 which have their control gates connected to another word line 73. The erase gates of each of the cells 63–66 and 69–72 in both rows are connected together to a line 75. As will be recognized, as shown in FIG. 2A, the control gate and word line are formed from a single strip of conductively doped polysilicon, and the erase gates are all formed from a single strip of conductively doped polysilicon that interfaces the floating gates on each side of it in both rows. This unit of a pair of memory cell rows and a common erase gate is repeated across the array.

Some of the peripheral circuits included on the same integrated circuit chip as the array 61 which are required for its operation are also shown in general terms in FIG. 6. Source and drain diffusions 77–81 form the memory bit lines and are biased by circuits 83. At an opposite end of the bit lines, circuits 85 include a decoder to address the appropriate lines to access memory cells within the array, in response to an address from an address bus 87. When the bit lines are addressed, proper voltages are applied from a source 89 that is controlled by lines 91. Circuits 85 also include sense amplifiers which measure the current through addressed cells in order to provide data in circuits 93 which indicate their states. Peripheral circuits 95 decode addresses in the bus 87 in order to apply a selected voltage from a supply 97 to one or more erase gates in the array. Similarly, circuits 99 select among the word lines for applying an appropriate voltage from a source 101.

Since two sectors share the same erase gate, some technique must be provided for selectively erasing the memory cells in either one of the sectors without effecting the other. How this is done is explained with respect to FIG. 7. During erase, a common erase gate 103 can be raised during erase to a $V_{EG}=20$ volts or more, as is done now. If a row 104 on one side of the erase gate is to be erased, the control gate 105 of that row may be held at $V_{CG1}=0$ volts, as is done now. In order to prevent erasure of the memory cells in a row 106 on an opposite side of the erase gate 103, a voltage $V_{CG2}$ of the control gate 107 for that row is applied such that under this bias, there is little or no potential difference between the floating gates of the row 106 and the erase gate 103, and so is insufficient to cause electrons to tunnel through the dielectric between them. On the other hand, if it is desired to erase the row 106, and not erase the row 104, then the voltage $V_{CG2}$ is made to be about zero volts and the voltage $V_{CG1}$ is raised to a level which causes the potential difference between the floating gates of the row 104 and the erase gate 103 to be less than that which would cause electrons to tunnel from the row 104 floating gates to the erase gate. During the erase of either row, the voltage $V_S$ of the source, $V_D$ of the drain and $V_B$ of the substrate are each held at zero volts.

As is well known, each of the control and erase gates are field coupled to the floating gate of each cell in a manner that can be expressed by an electrical equivalent circuit of the type shown in FIG. 8. A floating gate voltage $V_{FG}$ is determined by the amount of electrical charge on the gate and the voltages $V_{CG}$ and $V_{EG}$ of the control and erase gates which are coupled to the floating gate through equivalent capacitances $C_{CF}$ and $C_{EF}$ respectively. In order to create an erase condition, a voltage $V_{EF}$ across the erase gate dielectric must exceed a threshold $V_{TUN}$ that is shown in FIG. 9. FIG. 9 gives a typical current-voltage characteristic of a tunnel dielectric positioned between the floating gate and the erase gate of an EEPROM cell. Once the voltage across that dielectric exceeds $V_{TUN}$, the current $I_{EF}$ goes up very fast as a function of that voltage.

The equivalent memory cell circuit of FIG. 8 indicates the capacitive coupling between the three gates. The controllable voltages $V_{CG}$ and $V_{EF}$ are thus set in a manner to exceed $V_{TUN}$ for an erase condition, or to be substantially less than $V_{TUN}$ at all other times. Thus, although the specific control gate and erase gate voltages expressed with respect to FIG. 7 are convenient, there is a wide range of such relative voltages which will provide the desired $V_{EF} < V_{TUN}$ for the row of cells not being erased and $V_{EF} > V_{TUN}$ for the row of cells that is being erased. As used herein, the voltage on the control gate of the row not being erased is said to be "substantially the same" as the erase gate voltage when they are close enough so that the voltage $V_{EF}$ across the erase gate dielectric is less than $V_{TUN}$. There can actually be a several volt difference between them, without affecting the results, but it is usually most convenient to make them the same.

Rather than hold the control gate of a row being erased at 0 volts and raise the erase gate to 20 or more volts, it has been found preferable to apply voltages to these two electrodes that are substantially equal in magnitude but opposite in sign. Thus, $V_{EG}$ is made to be only about 12 or 13 volts, and the $V_{CG}$ of the sector/row to be erased is set at a $-12$ or $-13$ volts. For most structures, a maximum voltage within a range of from 8 to 15 volts is thus required. Although this requires supplying a negative voltage for erase, which adds some complexity to the memory system on the integrated circuit chip, the advantages of reducing the magnitude of the erase voltage outweighs this disadvantage. The erase gate voltages are generated in block 97 of the system illustrated in FIG. 6. The control gate voltages are generated in the block 101 of FIG. 6.

In addition to responding to an increase in the data density resulting from improvements in processing technology, the techniques of the present invention can also be utilized where the physical size of the array has not shrunk significantly but rather the data density contained in the array is increased by multi-state operation of the individual cells. That is, rather than operating the existing array of FIG. 1 with each of its memory cells storing a 0 or a 1, they can be operated, for example, to store one of four different detectable states, thereby storing two bits of information in each cell. This has the same effect as increasing the physical density of the array in the manner described with respect to FIG. 5A. A sector's worth of data is now stored in one row of cells. A unit of two rows of cells and a common erase gate are then operated in a manner described with respect to FIGS. 7–9.

Multi-state operation of a flash EEPROM system is described in U.S. Pat. Nos. 5,172,338, 5,268,870 and 5,270,979. These patents are incorporated herein by this reference. It will be noted that multi-state operation is not limited to four states per cell but rather can be any number that can be practically implemented.

The memory array architecture described above also lends itself to operation in either of two or four memory states without having to alter the chip physically. In the existing array of FIG. 1, both rows of cells on either side of an erase gate constitute a sector when using two storage states per cell. If that is increased to four storage states per cell, in multi-state operation, the same amount of data can be stored in only one row. A sector is reduced from two rows to one row. But this is no problem with the operating techniques of the present invention described with respect to FIGS. 7–9, since each row (a single sector in multi-state operation) can be erased individually without affecting the other row. Thus, a single chip can be operated with either of two different number of states that are related by a factor of two, without having to make any physical change to the array itself or change the size of the sector in terms of the number of data bits contained in it.

Although the present invention has been described with respect to its preferred embodiments, it will be understood that the invention is entitled to protection within the full scope of the appended claims.

It is claimed:

1. An array of non-volatile floating gate memory cells arranged on an integrated circuit in rows and columns, comprising:

a plurality of control gates elongated in a first direction and spaced apart in a second direction, said first and second directions being substantially perpendicular to each other, a plurality of erase gates elongated in said first direction, spaced apart in said second direction, and respectively positioned adjacent to corresponding rows of memory cells in such a manner that the individual erase gates are coupled with a plurality of corresponding floating gates of individual ones of the adjacent rows of memory cells, and means connected to the control and erase gates for removing charge from the corresponding floating gates in a corresponding adjacent row of memory cells of a selected one of the erase gates without disturbing a charge on the corresponding floating gates of the memory cells in another corresponding adjacent row of memory cells of the selected one of the erase gates.

2. An array of non-volatile floating gate memory cells arranged on an integrated circuit in rows and columns, comprising:

individual control gates extending along individual rows of memory cells, a plurality of elongated erase gates positioned in between the rows of memory cells in a manner that the individual erase gates are coupled with the floating gates of the rows of memory cells adjacent opposite sides of the erase gates, and means connected to the control and erase gates for removing charge from the floating gates in a row of memory cells positioned on one side of a selected one of the erase gates without disturbing a charge on the floating gates of the memory cells in a row of memory cells positioned on an opposite side of the selected erase gate, wherein layers of tunnel dielectric are positioned between the individual erase gates and the floating gates of the memory cells in the rows on either side of the individual erase gates, said layers of tunnel dielectric being characterized by exhibiting electron current flow therethrough from a floating gate to an erase gate when a voltage across the layer exceeds an erase threshold voltage, said charge removing means including means for simultaneously applying a first voltage to said selected erase gate, a second voltage to the control gate extending along a row of memory cells positioned on said one side of the selected erase gate, and a third voltage to the control gate extending along a row of memory cells positioned on said opposite side of the selected erase gate, a difference between the first and second voltages being sufficient to cause said erase threshold voltage to be exceeded for the memory cells in the row on said one side of the selected erase gate and a difference between the first and third voltages being such that said erase threshold voltage is not exceeded for the memory cells in the row on the opposite side of the selected erase gate.

3. An array of non-volatile floating gate memory cells arranged on an integrated circuit in rows and columns, comprising:

individual control gates extending along individual rows of memory cells, a plurality of elongated erase gates positioned in between the rows of memory cells in a manner that the individual erase gates are coupled with the floating gates of the rows of memory cells adjacent opposite sides of the erase gates, and means connected to the control and erase gates for removing charge from the floating gates in a row of memory cells positioned on one side of a selected one of the erase gates without disturbing a charge on the floating gates of the memory cells in a row of memory cells positioned on an opposite side of the selected erase gate, wherein said charge removing means includes means for simultaneously applying a first voltage to said selected erase gate, a second voltage to the control gate extending along a row of memory cells positioned on said one side of the selected erase gate, and a third voltage to the control gate extending along a row of memory cells positioned on said opposite side of the selected erase gate, said first and third voltages being substantially the same and differing from the second voltage by an amount sufficient to cause the floating gates of the memory cells on said one side of the selected erase gate to be erased.

4. The memory cell array according to claim 3 wherein said voltage supplying means includes means for applying said first and second voltages with substantially equal values but opposite signs.

5. The memory system according to claim 3 wherein the magnitude of each of the first and second voltages lies within a range of about 8 to 15 volts.

6. A non-volatile memory system, comprising:

a plurality of floating gate memory cells having control gates and erase gates, said memory cells being arranged in groups of cells which have their erase gates connected together, and means connectable to said control and erase gates for applying a first voltage to the commonly connected erase gates of a group of memory cells and a second voltage to the control gates of the same group of memory cells, wherein the first and second voltages have substantially the same magnitude but opposite signs, whereby the magnitude of the first voltage required to erase the group of memory cells is minimized.

7. The memory system according to claim 6 wherein the magnitude of the first and second voltages lies within a range of about 8 to 15 volts.

8. A method of operating a flash EEPROM system which includes an array of memory cells which individually have an electrically floating gate that is coupled through one dielectric layer to a first electrode and through a second dielectric layer to a second electrode, comprising:

providing a first voltage to the first electrode of each of a first group of memory cells, providing a second voltage to the first electrode of each of a second group of memory cells different from the first group, providing a third voltage to the second electrode of the memory cells within both of said first and second groups, providing the first and third voltages with a difference that is sufficient to cause electrons to tunnel between the floating gates of the first group of memory cells and their respective second electrodes, and providing the second and third voltages with a difference that is insufficient to significantly disturb a level of charge on the floating gates of the second group of memory cells.

9. The method of claim 8 wherein the first and second voltages are provided to be substantially equal but with opposite polarities.

10. The method of claim 8 wherein none of the first, second or third voltages exceed about 15 volts.

11. The method of any one of claims 8–10 wherein the providing of the second and third voltages is accomplished by providing relative values of the second and third voltages that cause electrons to tunnel through the second dielectric layer from the floating gates of the second group of memory cells to their respective second electrodes.

12. The method of any one of claims 8–10 wherein the method includes operating the system with the first and second electrodes in a form of control and erase gates, respectively.

13. The memory array according to claim 1 wherein said plurality of erase gates are respectively substantially positioned in between corresponding adjacent rows of memory cells.

14. The memory array according to claim 1 wherein said plurality of erase gates are respectively substantially positioned in between the control gates of corresponding adjacent rows of memory cells.

15. The memory array according to claim 1 wherein said plurality of erase gates are respectively substantially positioned in alternating spaced apart areas of said plurality of control gates.

* * * * *